(12) United States Patent
Light et al.

(10) Patent No.: US 8,728,721 B2
(45) Date of Patent: May 20, 2014

(54) METHODS OF PROCESSING SUBSTRATES

(75) Inventors: Scott L. Light, Boise, ID (US); Kaveri Jain, Boise, ID (US); Zishu Zhang, Boise, ID (US); Anton J deVilliers, Boise, ID (US); Dan Millward, Boise, ID (US); Jianming Zhou, Boise, ID (US); Michael D. Hyatt, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 44 days.

(21) Appl. No.: 13/205,004

(22) Filed: Aug. 8, 2011

(65) Prior Publication Data

US 2013/0040245 A1 Feb. 14, 2013

(51) Int. Cl.
*G03F 7/20* (2006.01)

(52) U.S. Cl.
USPC .......................................... 430/322

(58) Field of Classification Search
USPC .......................... 430/322, 323, 394
See application file for complete search history.

(56) References Cited

U.S. PATENT DOCUMENTS

| 7,820,550 | B2 | 10/2010 | Nyhus et al. |
| 2005/0196684 | A1* | 9/2005 | Nakamura et al. ................ 430/5 |
| 2006/0160028 | A1* | 7/2006 | Lee et al. ...................... 430/312 |
| 2008/0009138 | A1 | 1/2008 | Lee |
| 2008/0292991 | A1 | 11/2008 | Wallow et al. |
| 2009/0042147 | A1* | 2/2009 | Tsubaki ....................... 430/326 |
| 2010/0062380 | A1* | 3/2010 | Takemura et al. ............ 430/326 |
| 2010/0297554 | A1* | 11/2010 | Watanabe et al. .......... 430/270.1 |
| 2010/0323305 | A1 | 12/2010 | Tsubaki et al. |

FOREIGN PATENT DOCUMENTS

WO WO 2010/098493 9/2010

* cited by examiner

*Primary Examiner* — Brittany Raymond
(74) *Attorney, Agent, or Firm* — Wells St. John, P.S.

(57) ABSTRACT

A method of processing a substrate includes forming first photoresist on a substrate. A portion of the first photoresist is selectively exposed to actinic energy and then the first photoresist is negative tone developed to remove an unexposed portion of the first photoresist. Second photoresist is formed on the substrate over the developed first photoresist. A portion of the second photoresist is selectively exposed to actinic energy and then the second photoresist is negative tone developed to remove an unexposed portion of the second photoresist and form a pattern on the substrate which comprises the developed first photoresist and the developed second photoresist. Other implementations are disclosed.

12 Claims, 5 Drawing Sheets

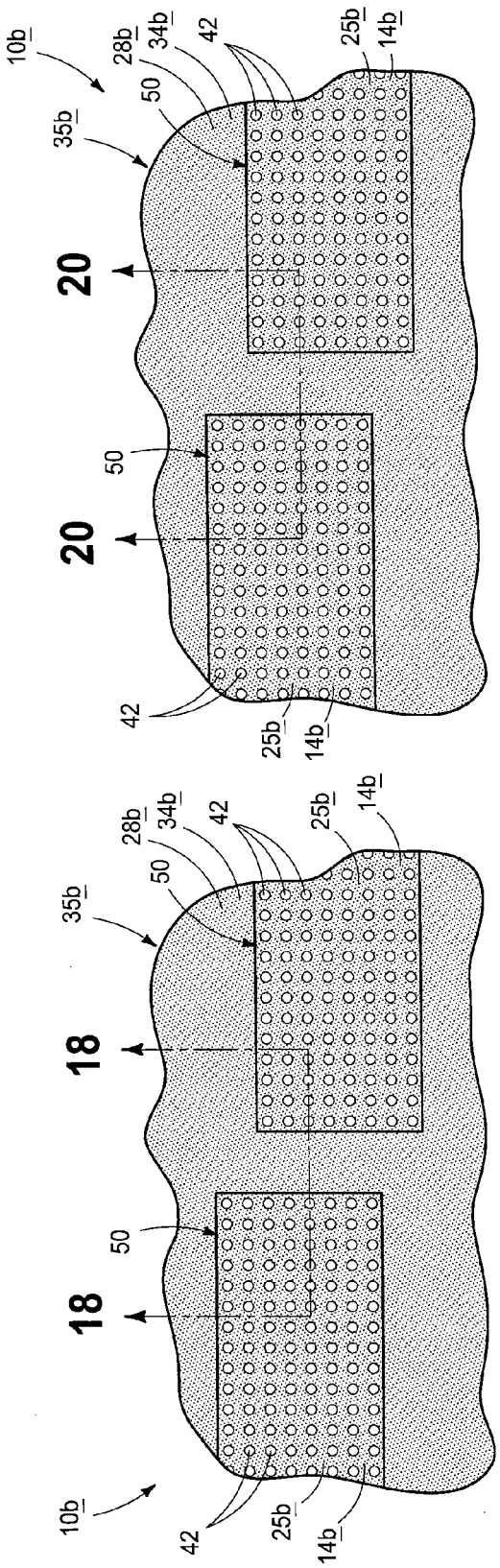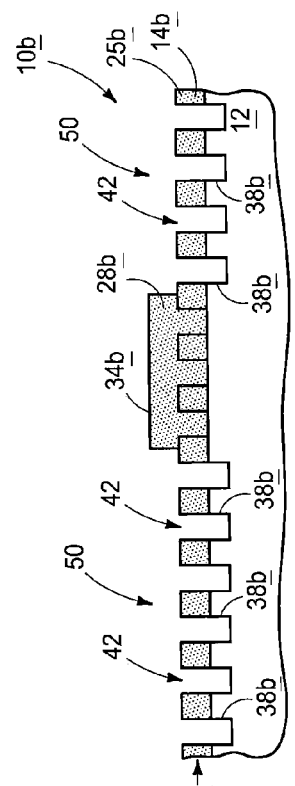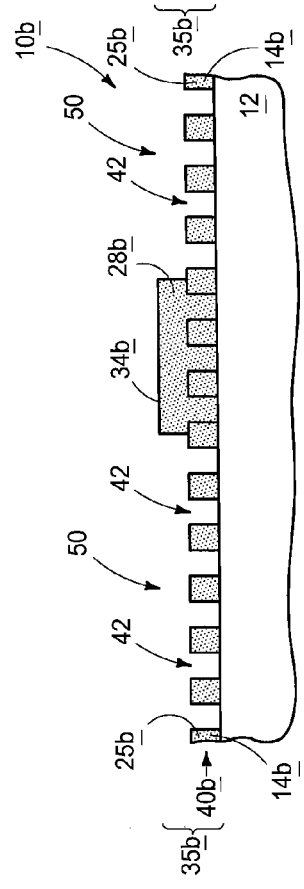

METHODS OF PROCESSING SUBSTRATES

TECHNICAL FIELD

Embodiments disclosed herein pertain to methods of processing substrates, for example to form patterns thereon using negative tone developing of photoresist.

BACKGROUND

Integrated circuits may be formed on a semiconductor substrate such as a silicon wafer or other semiconducting material. In general, layers of various materials which are either semiconducting, conducting or insulating are used to form the integrated circuits. By way of example, the various materials are doped, ion implanted, deposited, etched, grown, etc. using various processes. A continuing goal in semiconductor processing is to continue to reduce the size of individual electronic components thereby enabling smaller and denser integrated circuitry.

One technique for patterning and processing semiconductor substrates is photolithography. Such includes deposition of a patternable masking material commonly known as photoresist. These materials can be processed to modify their solubility in certain solvents, and are thereby readily usable to form patterns on a substrate. For example, portions of a photoresist layer can be exposed to actinic energy through openings in a radiation-patterning tool, such as a mask or reticle, to change the solvent solubility of the exposed regions versus the unexposed regions compared to the solubility in the as-deposited state. Thereafter, the exposed or unexposed regions can be removed, depending on the type of photoresist processing, thereby leaving a masking pattern of the remaining photoresist on the substrate. Areas of the underlying substrate next to the masked portions can be processed, for example by etching or ion implanting, to effect the desired processing of the substrate adjacent the masking material. In certain instances, multiple different layers of photoresist and/or a combination of photoresists with non-radiation sensitive masking materials are used.

The continual reduction in feature sizes places ever greater demands on the techniques used to form the features. For example, photolithography is commonly used to form patterned features, such as conductive lines and contact openings. A concept commonly referred to as "pitch" can be used to describe the sizes of the features in conjunction with spaces immediately adjacent thereto. Pitch may be defined as the distance between an identical point in two neighboring features of a repeating pattern in a straight line cross section, thereby including the maximum width of the feature and the space to the next immediately adjacent feature. Due to factors such as optics and light or radiation wave length, photolithography techniques tend to have a minimum pitch below which a particular photolithographic technique cannot reliably form features. Processing techniques to overcome these limitations include pitch multiplication and multiple patterning of the same layer, or of different layers, of photoresist.

BRIEF DESCRIPTION OF THE DRAWINGS

FIG. 17 is a view of the FIG. 15 substrate at a processing step subsequent to that shown by FIG. 15.

FIG. 18 is an enlarged sectional view taken through line 18-18 in FIG. 17.

FIG. 19 is a view of the FIG. 17 substrate at a processing step subsequent to that shown by FIG. 17.

FIG. 20 is an enlarged sectional view taken through line 20-20 in FIG. 19.

DETAILED DESCRIPTION OF EXAMPLE EMBODIMENTS

Figure 1:
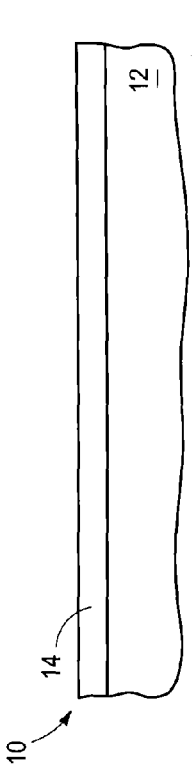
FIG. 1 is a diagrammatic sectional view of a substrate in process in accordance with an embodiment of the invention.

Example embodiments of methods of processing substrates are initially described with reference to FIGS. 1-7. Referring to FIG. 1, a substrate fragment 10 includes substrate material 12 over which a first photoresist 14 has been formed. Substrate material 12 may be homogenous or non-homogenous, and may comprise a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate material 12 may include various circuit components that may be in different states of fabrication.

In one embodiment, first photoresist 14 is soluble in a first organic solvent and is insoluble in multiple different composition liquids that are polar. Some example organic solvents include at least one of propylene glycol methyl ether acetate, propylene glycol monomethyl ether, ethylene glycol ether, cellosolve acetate, n-butyl acetate, anisole, methyl amyl ketone, and cyclohexanone. In one embodiment, the multiple different polar liquids are aqueous and basic. Some example polar liquids include tetramethyl ammonium hydroxide solutions, tetrabutyl ammonium hydroxide solutions, tetra-alkyl phosphonium hydroxide solutions, tetra-alkyl antimonium hydroxide solutions, methanol, ethanol, propanol, and isopropanol. First photoresist 14 may be homogenous or non-homogenous. As examples only, first photoresist 14 may be what persons of skill in the art at this time consider a positive-type photoresist that contains one or more photo-acid generators which release acid upon exposure to actinic energy, and which subsequently undergo a deprotection reaction upon post-exposure baking. However, other photoresists may be used regardless of whether considered as being of positive-type.

Figure 2:
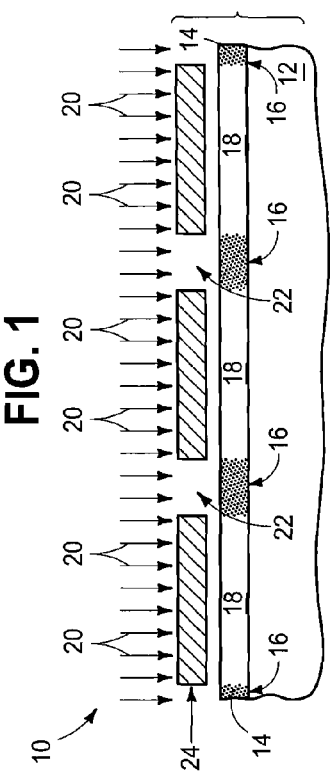
FIG. 2 is a view of the FIG. 1 substrate at a processing step subsequent to that shown by FIG. 1.

Referring to FIG. 2, a portion of first photoresist 14 has been selectively exposed to actinic energy, for example to form exposed portions 16 and unexposed portions 18. For convenience and clarity in the drawings, portions of substrates that have been exposed to patterning actinic energy are depicted with stippling and unexposed portions are shown without stippling. Actinic energy is represented by downwardly directed arrows 20 which pass through openings 22 of a suitable radiation patterning tool 24. Portions 16 and 18 may be of any desired shape or shapes. Further, not all portions 16 need be of the same shape and not all portions 18 need be of the same shape. Exposed portions 16 may be considered collectively as an "exposed portion", and unexposed portions 18 may be considered collectively as an "unexposed portion". In one embodiment, the selectively exposing renders the exposed portion of first photoresist 14 insoluble in the first organic solvent.

Figure 3:
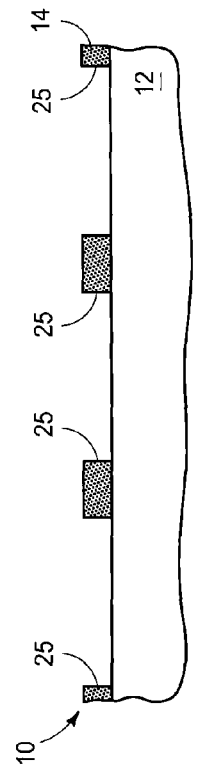
FIG. 3 is a view of the FIG. 2 substrate at a processing step subsequent to that shown by FIG. 2.

Referring to FIG. 3, first photoresist 14 of FIG. 2 has been negative tone developed to remove the unexposed portions 18 (not shown) of first photoresist 14, thereby leaving developed first photoresist 25 over substrate material 12. In one embodiment, the negative tone developing uses the first organic solvent to remove the unexposed portions of the first photoresist. Additional processing may occur relative to any of the substrates of FIGS. 1-3 at any time, for example, pre-baking, post-exposure baking, cleaning, etc.

Figure 4:
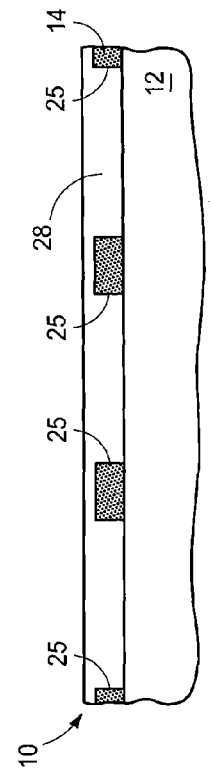
FIG. 4 is a view of the FIG. 3 substrate at a processing step subsequent to that shown by FIG. 3.

Referring to FIG. 4, second photoresist 28 has been formed on the substrate over developed first photoresist 25. In one embodiment, second photoresist 28 is formed directly against developed first photoresist 25 and/or directly against substrate material 12. In this document, a material or structure is "directly against" another when there is at least some physical touching contact of the stated materials or structures relative one another. In contrast, "over" encompasses "directly against" as well as construction where intervening material(s) or structure(s) result(s) in no physical touching contact of the stated materials or structures relative one another. Second photoresist 28 may be homogenous or non-homogenous. In one embodiment, second photoresist 28 is soluble in a second organic solvent and is insoluble in the multiple different polar liquids (e.g., multiple basic aqueous solutions) in which the first photoresist is insoluble. The first and second organic solvents may be of the same composition or of different compositions.

Figure 5:
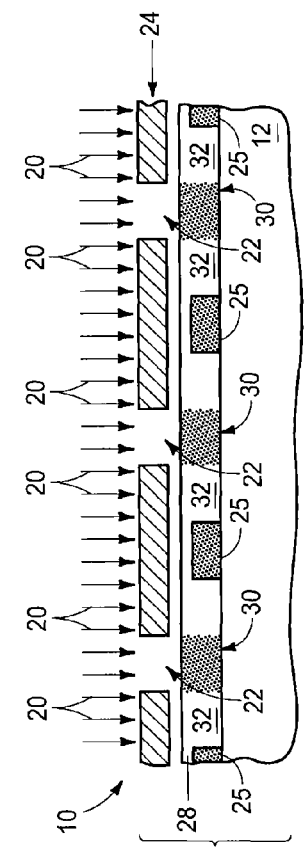
FIG. 5 is a view of the FIG. 4 substrate at a processing step subsequent to that shown by FIG. 4.

Referring to FIG. 5, a portion of second photoresist 28 has been selectively exposed to actinic energy, for example forming exposed portions 30 and unexposed portions 32. Actinic energy is again represented by downwardly directed arrows 20 passing through openings 22 received within a suitable radiation patterning tool 24. Portions 30 and 32 may be of any desired shape or shapes. Further, not all portions 30 need be of the same shape and not all portions 32 need be of the same shape. Exposed portions 30 may be considered collectively as an "exposed portion", and unexposed portions 32 may be considered collectively as an "unexposed portion". The actinic energy exposures of FIGS. 2 and 5 may be of the same wavelength or of different wavelengths, and of the same or different intensities. Further, the same radiation patterning tool or different radiation patterning tools may be used for the different exposures. In one embodiment, the first and second photoresists are of the same composition at least immediately prior to their respective exposing to actinic energy. In one embodiment, the first and second photoresists are of different compositions at least immediately prior to their respective exposing to actinic energy. In one embodiment, the act of selectively exposing a portion of the second photoresist to actinic energy renders the exposed portion of the second photoresist insoluble in the second organic solvent.

Figure 6:
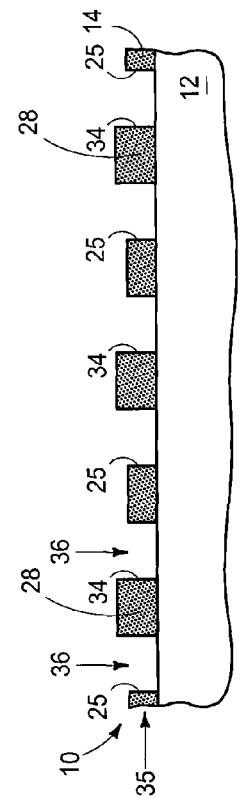
FIG. 6 is a view of the FIG. 5 substrate at a processing step subsequent to that shown by FIG. 5.

Referring to FIG. 6, second photoresist 28 has been negative tone developed to remove unexposed portions 32 (not shown) of the second photoresist, thereby forming developed second photoresist 34. Developed first photoresist 25 and developed second photoresist 34 combine to form a pattern 35 on the substrate which comprises openings 36 there-through. The developed first photoresist of the pattern and the developed second photoresist of the pattern may comprise respective elevationally outermost surfaces that are elevationally coincident relative to one another (not shown), or which are not elevationally coincident relative to one another (as shown). In one embodiment, the elevationally outermost surfaces of the developed second photoresist of the pattern are elevationally outward of the elevationally outermost surfaces of the developed first photoresist of the pattern. The elevationally outermost surfaces of the individual developed photoresist masses need not be planar nor at a single elevation. Regardless, in one embodiment the negative tone developing uses the second organic solvent. In one embodiment and as shown, pattern 35 comprises alternating singular features (e.g., 25/34/25/34/etc.) of developed first photoresist 25 and developed second photoresist 34 in at least one straight line cross section of the substrate, for example that cross section depicted by FIG. 6. Additional processing may occur relative to any of the substrates of FIGS. 4-6 at any time, for example, pre-baking, post-exposure baking, cleaning, etc.

In one embodiment, first photoresist 14 of developed first photoresist 25 is subjected to a post-develop bake prior to exposing the second photoresist to actinic energy. Such may or may not occur before deposition of the second photoresist. Regardless, in this embodiment the method through fabrication of the pattern which comprises the developed first and second photoresists may be devoid of any dedicated treatment of the first photoresist after post-develop bake to decrease its solubility in the second organic solvent.

Figure 7:
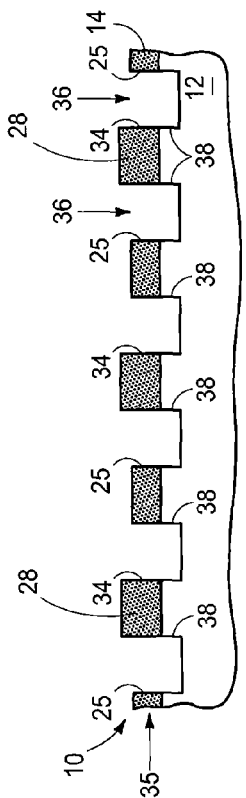
FIG. 7 is a view of the FIG. 6 substrate at a processing step subsequent to that shown by FIG. 6

Mask pattern 35 may be used in the processing of substrate material there-beneath, for example to transfer at least a portion of the mask pattern into substrate material 12 over which the first and second photoresists were formed. As examples, such processing or transferring at least a portion of the pattern into substrate material 12 may include ion implanting and/or etching. FIG. 7 depicts example etching through openings 36 in mask pattern 35 to form openings 38 in substrate material 12. Mask pattern 35 ultimately may be removed (not shown) from the substrate.

Figure 8:
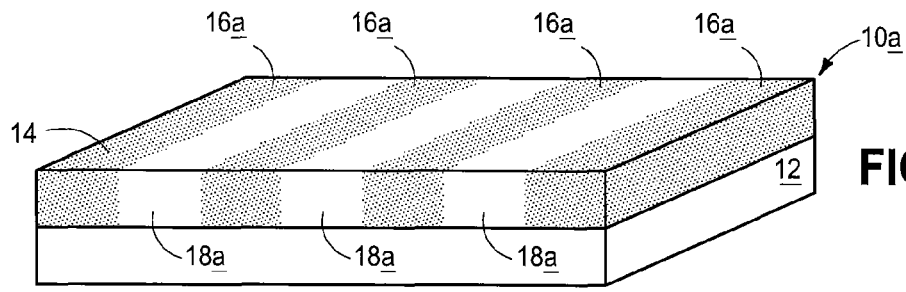
FIG. 8 is a diagrammatic oblique view of a substrate in process in accordance with an embodiment of the invention.

Additional example embodiments of methods of processing a substrate are next described with reference to FIGS. 8-12 with respect to a substrate fragment 10a. Like numerals from the first-described embodiments have been used where appropriate, with some construction differences being indicated with the suffix "a" or with different numerals. In FIG. 8, a portion of first photoresist 14 has been selectively exposed to actinic energy, for example thereby forming exposed portions 16a and unexposed portions 18a.

Figure 9:
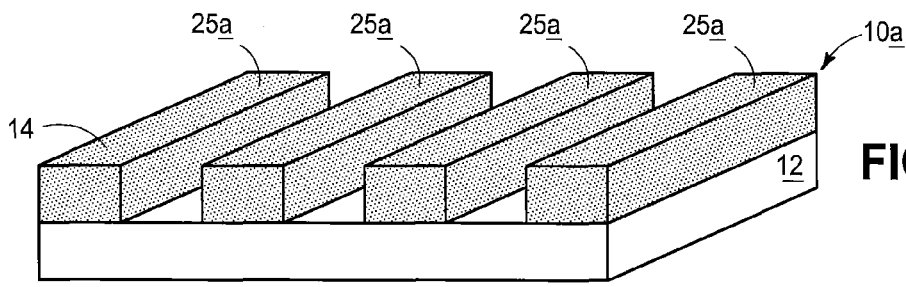
FIG. 9 is a view of the FIG. 8 substrate at a processing step subsequent to that shown by FIG. 8.

Referring to FIG. 9, first photoresist 14 has been negative tone developed to remove unexposed portions 18a (not shown), thereby forming developed first photoresist 25a.

Figure 10:
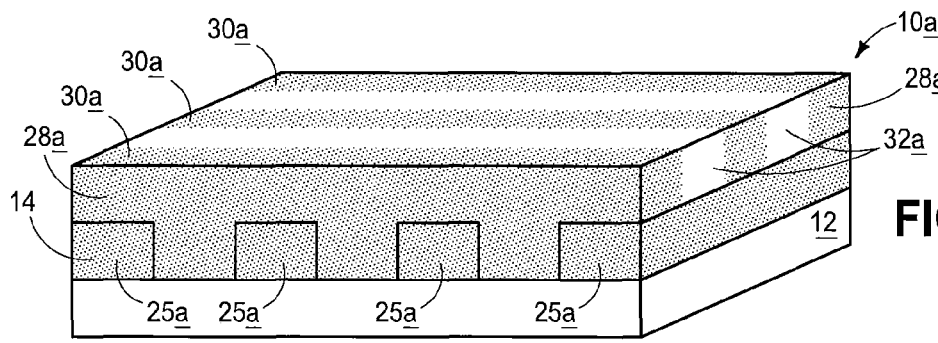
FIG. 10 is a view of the FIG. 9 substrate at a processing step subsequent to that shown by FIG. 9.

Referring to FIG. 10, second photoresist 28a has been formed on the substrate over developed first photoresist 25a. A portion of second photoresist 28a has been selectively exposed to actinic energy, for example thereby forming exposed portions 30a and unexposed portions 32a.

Figure 11:
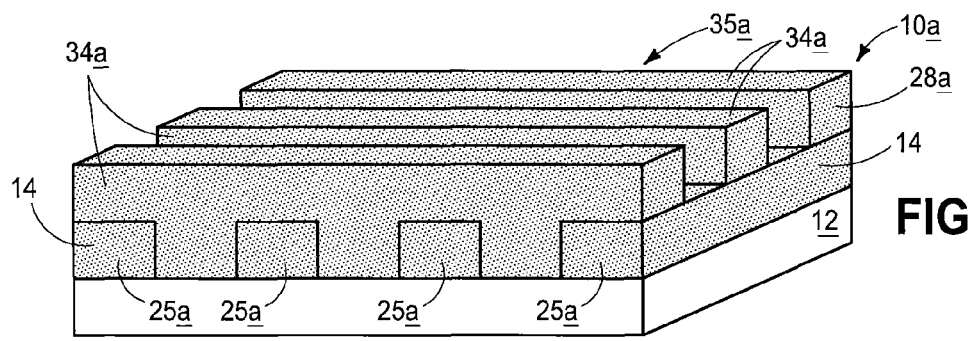
FIG. 11 is a view of the FIG. 10 substrate at a processing step subsequent to that shown by FIG. 10.
Figure 12:
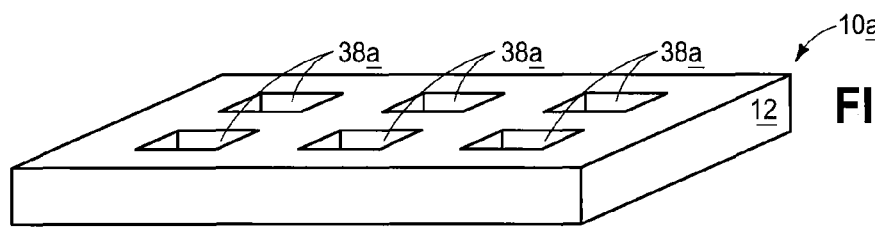
FIG. 12 is a view of the FIG. 11 substrate at a processing step subsequent to that shown by FIG. 11.

Referring to FIG. 11, second photoresist 28a has been negative tone developed to remove unexposed portions 32a (not shown), thereby forming developed second photoresist 34a. An example pattern 35a is thus formed on substrate 12 which comprises developed first photoresist 25a and developed second photoresist 34a. Openings thereby may be formed through a composite of the developed first photoresist 25a and developed second photoresist 34a. Such may be used to process substrate material there-below. For example, FIG. 12 depicts use of the openings in mask pattern 35a of FIG. 11 to form corresponding openings 38a into substrate material 12, followed by removal of mask pattern 35a (not shown).

FIG. 11 depicts but one example embodiment wherein a resultant mask pattern 35a comprises developed second photoresist 34a which is atop developed first photoresist 25a. FIGS. 1-7 depict an example embodiment wherein the resultant mask pattern 35 is devoid of any developed second photoresist atop developed first photoresist. Regardless, any of the example processing as described above with respect to the FIGS. 1-7 first embodiments may be used with respect to the FIGS. 8-12 embodiments.

Figure 13:
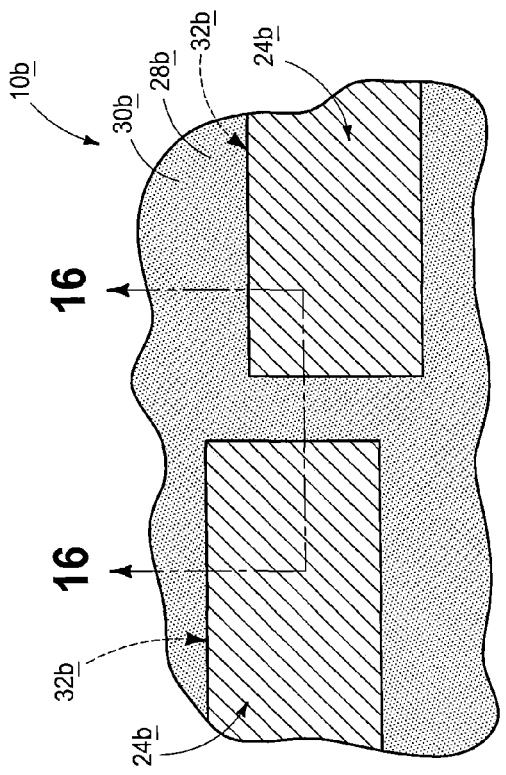
FIG. 13 is a diagrammatic top plan view of a substrate in process in accordance with an embodiment of the invention.
Figure 14:
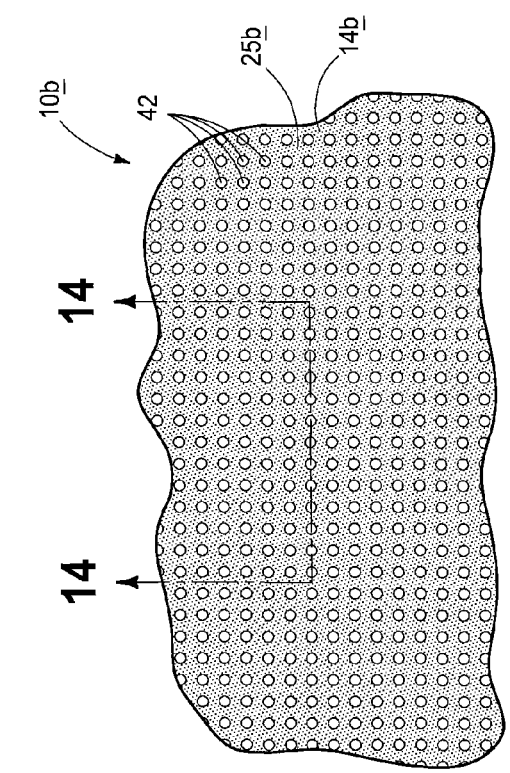
FIG. 14 is an enlarged sectional view taken through line 14-14 in FIG. 13.

Additional methods of processing a substrate are next described with reference to FIGS. 13-22 with respect to a substrate fragment 10b. Like numerals from the above-described embodiments have been used where appropriate, with some construction differences being indicated with the suffix "b" or with different numerals. Referring to FIGS. 13 and 14, first photoresist 14b has been formed on substrate material 12, a portion thereof selectively exposed to actinic energy, and then negative tone developed to form a mask pattern 40 comprising openings 42 through the first photoresist, thereby resulting in developed first photoresist 25b. Materials and processing as described above may be used. In one embodiment, openings 42 may be uniformly and continuously formed through first photoresist 14b throughout a continuous circumscribed area, for example for subsequent formation of contact openings.

Figure 15:
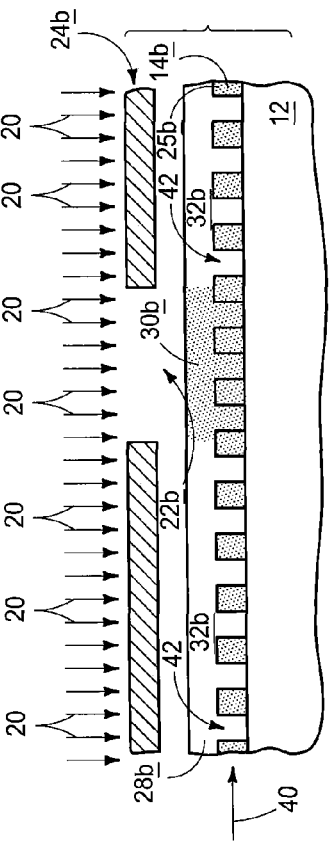
FIG. 15 is a view of the FIG. 13 substrate at a processing step subsequent to that shown by FIG. 13.
Figure 16:
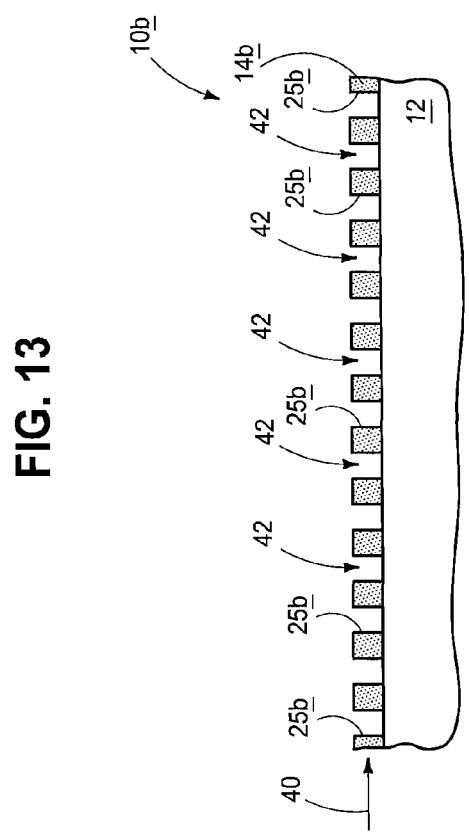
FIG. 16 is an enlarged sectional view taken through line 16-16 in FIG. 15.

Referring to FIGS. 15 and 16, second photoresist 28b has been formed within openings 42 and over developed first photoresist 25b between openings 42. A portion of second photoresist 28b has been selectively exposed to actinic energy, for example as depicted by downwardly directed arrows 20 passing through openings 22b of a suitable radiation patterning tool 24b. Thus, exposed portions 30b and unexposed portions 32b of second photoresist 28b have been formed.

Referring to FIGS. 17 and 18, second photoresist 28b has been negative tone developed to remove the unexposed portion thereof, thereby producing developed second photoresist 34b. The negative tone developing of second photoresist 28b unmasks developed first photoresist 25b from the second photoresist within substrate area 50 where second photoresist 28b was not exposed to actinic energy. Developed first photoresist 25b outside of substrate area 50 remains masked with developed second photoresist 34b. Regardless, FIGS. 17 and 18 depict an example pattern 35b which comprises developed first photoresist 25b and developed second photoresist 34b.

Further, FIGS. 17 and 18 depict an example pattern 35b which comprises developed second photoresist 34b atop developed first photoresist 25b.

Processing of substrate material is conducted through the openings in the unmasked developed first photoresist while the developed first photoresist outside of the substrate area is masked with developed second photoresist. Example such processing includes one or both of ion implanting and etching. For example, FIGS. 19 and 20 show use of mask pattern 35b to etch openings 38b into substrate material 12 through mask openings 42 in the unmasked developed first photoresist 25b within substrate area 50 while the developed first photoresist outside of substrate area 50 is masked with developed second photoresist 34b.

Figure 21:
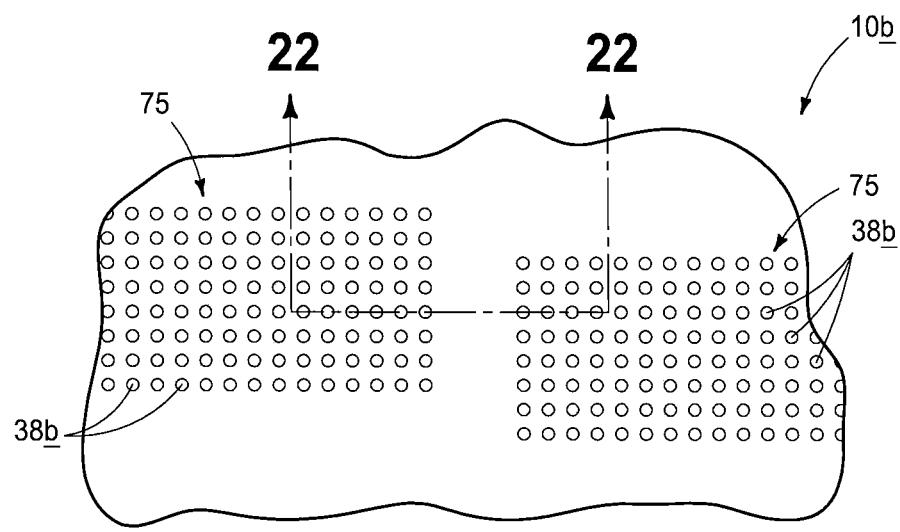
FIG. 21 is a view of the FIG. 19 substrate at a processing step subsequent to that shown by FIG. 19.
Figure 22:
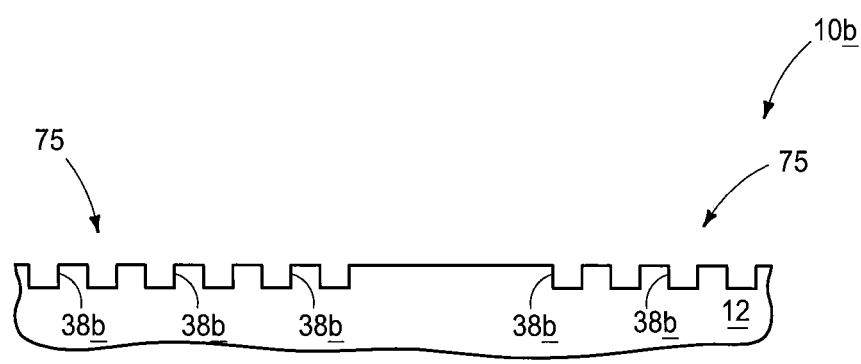
FIG. 22 is an enlarged sectional view taken through line 22-22 in FIG. 21.

Referring to FIGS. 21 and 22, remaining of the first and second developed photoresists (not shown) have been removed from the substrate, for example forming the depicted spaced contact patterns 75. Regardless, any of above-described processing with respect to FIGS. 1-22 may form circuit components, or may be formed in hard masking material used as an etch or other mask in processing material there-below.

Conclusion

In one embodiment, a method of processing a substrate includes forming first photoresist on a substrate. A portion of the first photoresist is selectively exposed to actinic energy and then the first photoresist is negative tone developed to remove an unexposed portion of the first photoresist. A second photoresist is formed on the substrate over the developed first photoresist. A portion of the second photoresist is selectively exposed to actinic energy and then the second photoresist is negative tone developed to remove an unexposed portion of the second photoresist and form a pattern on the substrate which comprises the developed first photoresist and the developed second photoresist.

In one embodiment, a method of processing a substrate includes forming first photoresist on a substrate. The first photoresist is soluble in a first organic solvent and insoluble in multiple different liquids that are polar. A portion of the first photoresist is selectively exposed to actinic energy to render the exposed portion of the first photoresist insoluble in the first organic solvent and then the first photoresist is negative tone developed using the first organic solvent to remove an unexposed portion of the first photoresist. Second photoresist is formed on the substrate over the developed first photoresist. The second photoresist is soluble in a second organic solvent and insoluble in the multiple different polar liquids. A portion of the second photoresist is selectively exposed to actinic energy to render the exposed portion of the second photoresist insoluble in the second organic solvent and then the second photoresist is negative tone developed using the second organic solvent to remove an unexposed portion of the second photoresist and form a pattern on the substrate which comprises the developed first photoresist and the developed second photoresist.

In one embodiment, a method of processing a substrate includes forming first photoresist on a substrate. A portion of the first photoresist is selectively exposed to actinic energy and then the first photoresist is negative tone developed to form openings through the first photoresist. Second photoresist is formed within the openings and over the developed first photoresist between the openings. A portion of the second photoresist is selectively exposed to actinic energy and then the second photoresist is negative tone developed to remove an unexposed portion of the second photoresist. The negative tone developing of the second photoresist unmasks the developed first photoresist from the second photoresist within substrate area where the second photoresist was not exposed to actinic energy and leaves the developed first photoresist outside of said substrate area masked with developed second photoresist. Substrate material is processed through the openings in the unmasked developed first photoresist while the developed first photoresist outside of said substrate area is masked with developed second photoresist. After the processing, remaining of the first and second developed photoresists is removed from the substrate.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of processing a substrate, comprising:
   forming first photoresist on a substrate;
   selectively exposing a portion of the first photoresist to actinic energy and then negative tone developing the first photoresist to remove an unexposed portion of the first photoresist;
   forming second photoresist on the substrate over the developed first photoresist; and
   selectively exposing a portion of the second photoresist to actinic energy and then negative tone developing the second photoresist to remove an unexposed portion of the second photoresist and form a pattern on the substrate which comprises the developed first photoresist and the developed second photoresist, the developed first photoresist of the pattern and the developed second photoresist of the pattern not overlapping one another and comprising respective elevationally outermost surfaces that are not elevationally coincident relative to one another, elevationally outermost surfaces of the developed first photoresist in the pattern being non-planar.

2. The method of claim 1 comprising transferring at least a portion of the pattern into substrate material over which the first and second photoresists were formed.

3. The method of claim 2 wherein the transferring comprises etching.

4. The method of claim 2 wherein the transferring occurs while all of both the developed first photoresist and the developed second photoresist remain over the substrate material.

5. The method of claim 1 wherein the elevationally outermost surfaces of the developed second photoresist of the pattern are elevationally outward of the elevationally outermost surfaces of the developed first photoresist of the pattern.

6. The method of claim 1 wherein elevationally outermost surfaces of the developed second photoresist in the pattern are non-planar.

7. A method of processing a substrate, comprising:
   forming first photoresist on a substrate;
   selectively exposing a portion of the first photoresist to actinic energy and then negative tone developing the first photoresist to remove an unexposed portion of the first photoresist;
   forming second photoresist on the substrate over the developed first photoresist; and
   selectively exposing a portion of the second photoresist to actinic energy and then negative tone developing the second photoresist to remove an unexposed portion of the second photoresist and form a pattern on the substrate which comprises the developed first photoresist and the developed second photoresist, the developed first photoresist of the pattern and the developed second photoresist of the pattern not overlapping one another and comprising respective elevationally outermost surfaces that are not elevationally coincident relative to one another, elevationally outermost surfaces of the developed second photoresist in the pattern being non-planar.

8. A method of processing a substrate, comprising:
   forming first photoresist on a substrate;
   selectively exposing a portion of the first photoresist to actinic energy and then negative tone developing the first photoresist to form openings through the first photoresist, the openings being uniformly and continuously formed through the first photoresist throughout a first continuous circumscribed area;
   forming second photoresist within the openings and elevationally over the developed first photoresist between the openings;
   selectively exposing a portion of the second photoresist to actinic energy and then negative tone developing the second photoresist to remove an unexposed portion of the second photoresist, the negative tone developing of the second photoresist unmasking the developed first photoresist from the second photoresist within substrate area where the second photoresist was not exposed to actinic energy and leaving the developed first photoresist outside of said substrate area masked with developed second photoresist, the developed first photoresist and the developed second photoresist comprising respective elevationally outermost surfaces that are not elevationally coincident relative to one another, the developed second photoresist comprising an opening therethrough which unmasks a second continuous circumscribed area that is laterally within the first continuous circumscribed area and comprises a plurality of the openings formed through the first photoresist, elevationally outermost surfaces of the developed first photoresist being non-planar;
   processing substrate material through the openings in the unmasked developed first photoresist while the developed first photoresist outside of said substrate area is masked with developed second photoresist; and
   after the processing, removing remaining of the first and second developed photoresists from the substrate.

9. The method of claim 8 wherein the developed second photoresist is directly against an elevationally outermost surface of the developed first photoresist.

10. The method of claim 9 wherein a lateral edge of the developed second photoresist that is directly against the elevationally outermost surface of the developed first photoresist defines a continuous perimeter of the second circumscribed area.

11. The method of claim 8 wherein the developed second photoresist comprises multiple of said openings therethrough which unmasks multiple second continuous circumscribed areas that are laterally within the first continuous circumscribed area and that individually comprises a plurality of the openings formed through the first photoresist.

12. A method of processing a substrate, comprising:
   forming first photoresist on a substrate;
   selectively exposing a portion of the first photoresist to actinic energy and then negative tone developing the first photoresist to form openings through the first photoresist, the openings being uniformly and continuously formed through the first photoresist throughout a first continuous circumscribed area;

forming second photoresist within the openings and elevationally over the developed first photoresist between the openings;

selectively exposing a portion of the second photoresist to actinic energy and then negative tone developing the second photoresist to remove an unexposed portion of the second photoresist, the negative tone developing of the second photoresist unmasking the developed first photoresist from the second photoresist within substrate area where the second photoresist was not exposed to actinic energy and leaving the developed first photoresist outside of said substrate area masked with developed second photoresist, the developed first photoresist and the developed second photoresist comprising respective elevationally outermost surfaces that are not elevationally coincident relative to one another, the developed second photoresist comprising an opening therethrough which unmasks a second continuous circumscribed area that is laterally within the first continuous circumscribed area and comprises a plurality of the openings formed through the first photoresist, elevationally outermost surfaces of the developed second photoresist being non-planar;

processing substrate material through the openings in the unmasked developed first photoresist while the developed first photoresist outside of said substrate area is masked with developed second photoresist; and after the processing, removing remaining of the first and second developed photoresists from the substrate.

* * * * *